(12) United States Patent
Wang (10) Patent No.: US 11,005,073 B2
(45) Date of Patent: May 11, 2021

(54) OLED DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Kun Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 36 days.

(21) Appl. No.: 16/494,319

(22) PCT Filed: May 15, 2019

(86) PCT No.: PCT/CN2019/086947
§ 371 (c)(1),
(2) Date: Sep. 16, 2019

(87) PCT Pub. No.: WO2020/191889
PCT Pub. Date: Oct. 1, 2020

(65) Prior Publication Data
US 2020/0373519 A1    Nov. 26, 2020

(30) Foreign Application Priority Data

Mar. 28, 2019    (CN) .......................... 201910244311.5

(51) Int. Cl.
*H01L 51/52* (2006.01)
*H01L 27/32* (2006.01)
*H01L 51/56* (2006.01)

(52) U.S. Cl.
CPC ...... *H01L 51/5265* (2013.01); *H01L 27/3234* (2013.01); *H01L 27/3246* (2013.01); *H01L 51/5253* (2013.01); *H01L 51/56* (2013.01); *H01L 2227/323* (2013.01); *H01L 2251/5315* (2013.01)

(58) Field of Classification Search
CPC ............. H01L 51/5265; H01L 27/3234; H01L 27/3246; H01L 51/5253; H01L 51/56; H01L 2227/323; H01L 2251/5315
See application file for complete search history.

(56) References Cited

U.S. PATENT DOCUMENTS

2016/0233278 A1* 8/2016 Yoon ...................... H01L 27/326
2017/0025486 A1* 1/2017 Kwon .................... H01L 51/525

* cited by examiner

Primary Examiner — Stephen W Smoot
Assistant Examiner — Vicki B. Booker (57) ABSTRACT

An OLED display panel and a manufacturing method of the OLED display panel are provided. A light-transmissive hole is in the OLED display panel, a blocking wall is arranged outside some sub-pixel regions around the light-transmissive hole, and a thin-film encapsulation layer is on the blocking wall. A portion of light emitted from the sub-pixel regions inside the blocking wall is reflected at an interface of the thin film encapsulation layer by total internal reflection to cause a bright light spot, so that an image can also be displayed in the light-transmissive hole. Therefore, an opening for an under-screen camera less affects aesthetics and appearance integrity of the OLED display panel.

20 Claims, 6 Drawing Sheets

OLED DISPLAY PANEL AND MANUFACTURING METHOD THEREOF

RELATED APPLICATIONS

This application is a National Phase of PCT Patent Application No. PCT/CN2019/086947 having International filing date of May 15, 2019, which claims the benefit of priority of Chinese Patent Application No. 201910244311.5 filed on Mar. 28, 2019. The contents of the above applications are all incorporated by reference as if fully set forth herein in their entirety.

FIELD AND BACKGROUND OF THE INVENTION

The present invention relates to a field of display devices and in particular, to an organic light emitting diode (OLED) display panel and a manufacturing method thereof.

Organic light-emitting diode (OLED) devices have advantages such as a simple structure, fast response, active illumination, and low power consumption, and have been widely used in the field of display devices such as mobile phones, tablet computers, and televisions. With the development of differentiated portable products, higher screen ratios have become a trend. In order to achieve ultimate full screen schemes, mobile phone manufacturers have adopted a variety of different designs, like notch screens, a waterdrop notch screens, pop-up cameras, and slide screens. These designs can all increase a screen ratio of mobile phones to a certain extent; however, all of them affects aesthetics and appearance integrity of the mobile phones, and limits a three-proof ability (waterproof, dustproof, and shock-resistant) of the mobile phones.

Mobile phone manufacturers are pursuing an ultimate full screen design, but a series of sensors such as a front camera occupy a space of the display panel and therefore limit a further increase of the screen ratio. In order to place the front camera under a screen of the display panel, an opening is defined in the display panel, but the opening for the camera compromises aesthetics and appearance integrity of the display panel and affects a display effect.

Therefore, there is a need to provide a new OLED display panel and a manufacturing method thereof to solve the above technical problems.

SUMMARY OF THE INVENTION

The present disclosure provides an organic light emitting diode (OLED) display panel and a manufacturing method thereof, which solves a technical problem that a conventional OLED display panel has an opening for an under-screen camera, which compromises aesthetics and appearance integrity of the display panel and affects a display effect.

Accordingly, the present invention provides a solution as follows.

The present invention provides an organic light emitting diode (OLED) display panel, comprising:

a substrate;

a pixel defining layer disposed on the substrate, a plurality of sub-pixel regions defined in the pixel defining layer, an organic light-emitting materials disposed in each of the sub-pixel regions, wherein a non-pixel region is defined in the pixel defining layer between each two adjacent sub-pixel regions;

a light-transmissive hole defined in the pixel defining layer, the light-transmissive hole penetrating the pixel defining layer;

a blocking wall disposed in the non-pixel region which is spaced apart from the light-transmissive hole by multiple ones of the sub-pixel regions, the blocking wall made of polystyrene;

a cathode electrode covering the blocking wall and the pixel defining layer; and a thin-film encapsulation layer disposed on the cathode electrode.

According to one embodiment of the OLED display panel of the present invention, the blocking wall is a ring-shaped inverted trapezoidal structure.

According to one embodiment of the OLED display panel of the present invention, a height of the blocking wall ranges from 1 to 10 um.

According to one embodiment of the OLED display panel of the present invention, the light-transmissive hole is filled with a high light-transmissive material.

According to one embodiment of the OLED display panel of the present invention, the high light-transmissive material is filled to a height level aligned with a top of the blocking wall.

According to one embodiment of the OLED display panel of the present invention, the light-transmissive hole has a diamond-shaped cross-section.

According to one embodiment of the OLED display panel of the present invention, the thin-film encapsulation layer comprises a first inorganic layer, a first organic layer, and a second inorganic layer sequentially disposed on the cathode electrode.

According to one embodiment of the OLED display panel of the present invention, a refractive index of the first inorganic layer is greater than a refractive index of the first organic layer.

According to one embodiment of the present invention, an organic light emitting diode (OLED) display panel is provided, comprising:

a substrate;

a pixel defining layer disposed on the substrate, a plurality of sub-pixel regions defined in the pixel defining layer, an organic light-emitting material disposed in each of the sub-pixel regions, wherein a non-pixel region is defined in the pixel defining layer between each two adjacent sub-pixel regions;

a light-transmissive hole defined in the pixel defining layer, the light-transmissive hole penetrating the pixel defining layer;

a blocking wall disposed in the non-pixel region which is spaced apart from the light-transmissive hole by multiple ones of the sub-pixel regions;

a cathode electrode covering the blocking wall and the pixel defining layer; and a thin-film encapsulation layer disposed on the cathode electrode.

According to one embodiment of the OLED display panel of the present invention, the blocking wall is a ring-shaped inverted trapezoidal structure.

According to one embodiment of the OLED display panel of the present invention, a height of the blocking wall ranges from 1 to 10 um.

According to one embodiment of the OLED display panel of the present invention, an inner side of the blocking wall is coated with a material of the cathode electrode.

According to one embodiment of the OLED display panel of the present invention, the light-transmissive hole is filled with a high light-transmissive material.

According to one embodiment of the OLED display panel of the present invention, the high light-transmissive material is filled to a height level aligned with a top of the blocking wall.

According to one embodiment of the OLED display panel of the present invention, the light-transmissive hole has a diamond-shaped cross-section.

According to one embodiment of the OLED display panel of the present invention, the thin-film encapsulation layer comprises a first inorganic layer, a first organic layer, and a second inorganic layer sequentially disposed on the cathode electrode.

According to one embodiment of the OLED display panel of the present invention, a refractive index of the first inorganic layer is greater than a refractive index of the first organic layer.

According to one embodiment of the present invention, a manufacturing method of an organic light emitting diode (OLED) display panel is provided, comprising steps as follows:

S10: providing a substrate;

S20: forming a pixel defining layer on the substrate, wherein a plurality of sub-pixel regions defined in the pixel defining layer, a non-pixel region is defined in the pixel defining layer between each two adjacent sub-pixel regions;

S30: forming a light-transmissive hole in the pixel defining layer, wherein the light-transmissive hole penetrates the pixel defining layer;

S40: forming a blocking wall disposed in the non-pixel region which is spaced apart from the light-transmissive hole by multiple ones of the sub-pixel regions;

S50: filling the sub-pixel regions with an organic light-emitting material;

S60: forming a cathode electrode on the blocking wall and the pixel defining layer;

S70: filling the light-transmissive hole with a high light-transmissive material; and S80: forming a thin film encapsulation layer on the cathode electrode.

In the manufacturing method of the OLED display panel according to one embodiment of the present invention, the thin-film encapsulation layer comprises a first inorganic layer, a first organic layer, and a second inorganic layer sequentially disposed on the cathode electrode, and a refractive index of the first inorganic layer is greater than a refractive index of the first organic layer.

In the manufacturing method of the OLED display panel according to one embodiment of the present invention, the high light-transmissive material is filled into the light transmissive hole by ink-jet printing.

Advantages of the present disclosure: In the OLED display panel and the manufacturing method thereof, the light-transmissive hole is defined in the OLED display panel, the blocking wall is disposed outside some of the sub-pixel regions around the light-transmissive hole, a thin-film encapsulation layer is disposed on the blocking wall, and light emitted from the sub-pixel regions inside the blocking wall is partially reflected by an inner light-transmitting surface of the blocking wall to reach the thin film encapsulation layer, thus causing total internal reflection at an interface of the thin film encapsulation layer and forming a bright light spot, so that an image can be displayed in the light-transmissive hole of the OLED display panel, and the displayed image is integrated with a surrounding image. Such configuration sufficiently reduces an influence of an opening for the under-screen camera on aesthetics and appearance integrity of the OLED display panel, and improves a display effect.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DESCRIPTION OF SPECIFIC EMBODIMENTS OF THE INVENTION

The following description is provided to illustrate specific embodiments of the present invention. Directional terms mentioned in this application, such as "upper", "lower", "front", "rear", "left", "right", "inside", "outside", "lateral", are only illustrative with reference to the drawings. Therefore, the directional terms are only for the purpose of illustration and for ease of understanding, and are not intended to be limiting. In the drawings, structurally similar elements are denoted by the same reference numerals.

The present disclosure aims to solve a problem that a conventional organic light emitting diode (OLED) display panel has an opening for an under-screen camera, which compromises aesthetics and appearance integrity of the display panel and affects a display effect.

First Embodiment

Figure 1A:
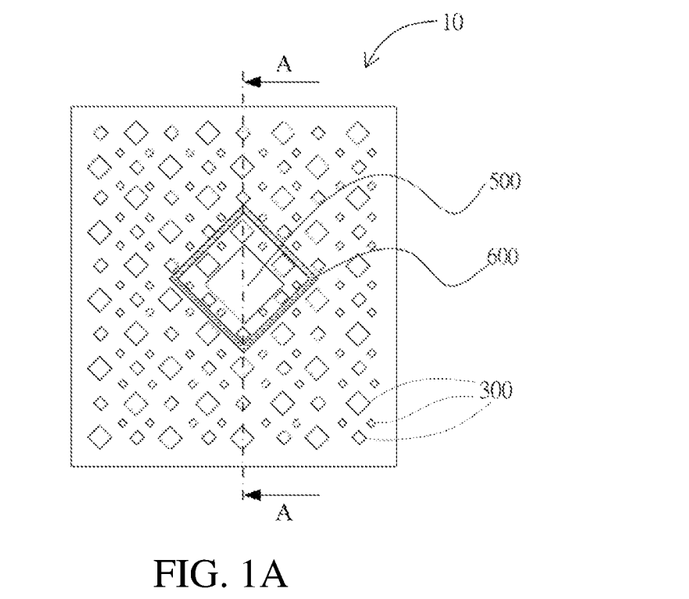
FIG. 1A is a structural view of an OLED display panel of a first type according to a first embodiment of the present invention.
Figure 1B:
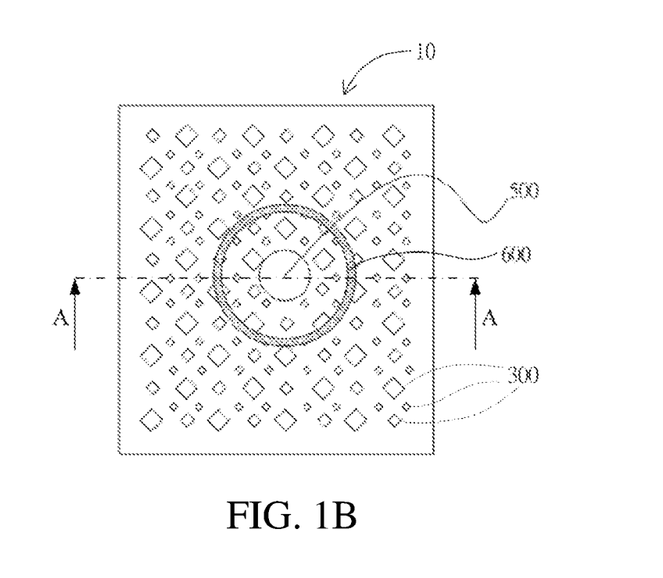
FIG. 1B is a structural view of an OLED display panel of a second type according to the first embodiment of the present invention.
Figure 1C:
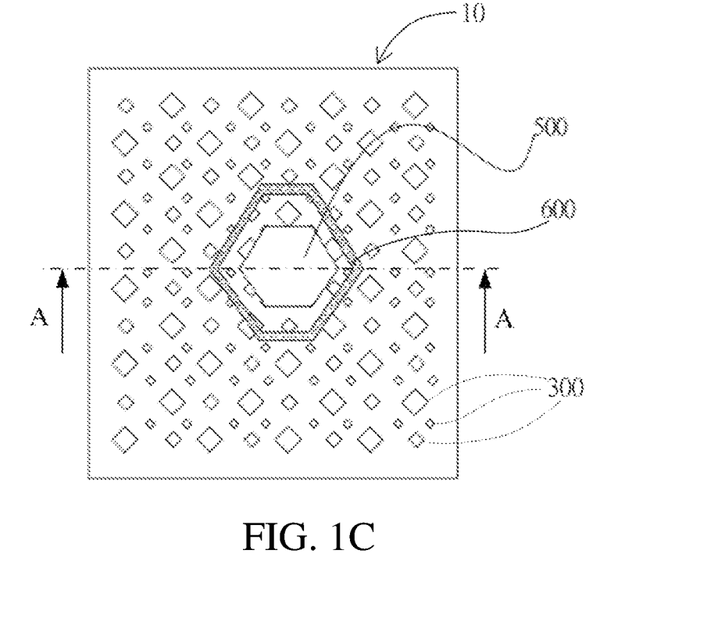
FIG. 1C is a top view illustrating an OLED display panel of a third type according to the first embodiment of the present invention.

Referring to FIG. 1, the present invention provides an OLED display panel 10 according to one embodiment of the present invention, comprising:

a substrate 100;

a pixel defining layer 200 disposed on the substrate 100, a plurality of sub-pixel regions 300 defined in the pixel defining layer 200, an organic light-emitting material disposed in each of the sub-pixel regions 300, the organic light-emitting material can display at least three different colors, wherein a non-pixel region 400 is defined in the pixel defining layer 200 between each two adjacent sub-pixel regions 300;

a light-transmissive hole 500 defined in the pixel defining layer 200, the light-transmissive hole 500 penetrating the pixel defining layer 200;

a blocking wall 600 disposed in the non-pixel region 400 which is spaced apart from the light-transmissive hole 500 by multiple ones of the sub-pixel regions 300;

a cathode electrode 700 covering the blocking wall 600 and the pixel defining layer 200; and a thin-film encapsulation layer 900 disposed on the cathode electrode 700.

Light emitted by the sub-pixel regions 300 in the blocking wall 600 is reflected at the thin film encapsulation layer 900 by total internal reflection.

The OLED display panel 10 further comprises a thin film transistor (TFT) array layer (not illustrated), a planarization layer (not illustrated), and an anode electrode (not illustrated) which are disposed between the substrate 100 and the pixel defining layer 200. The TFT array layer is disposed on the substrate 100, the planarization layer is disposed on the TFT array layer, and the anode electrode is disposed on the planarization layer and positioned in the sub-pixel regions 300. In other words, the light-transmissive hole 500 actually penetrates the planarization layer, the anode electrode, and the pixel defining layer 200, and the substrate 100 comprises the TFT array layer. It should be noted that, in the present embodiment, a direction from the substrate 100 to the pixel defining layer 200 is taken as an upward direction, and its opposite direction is a downward direction, wherein "on" or "under" only describes relative positions and may refer to a direct contact or indirect contact, so does not limit a specific structure.

The blocking wall 600 is made of polystyrene (PS). Since polystyrene has certain plasticity, a shape of the blocking wall 600 is not particularly limited. A height of the retaining wall 600 ranges from 1 to 10 um, and the blocking wall 600 is a ring-shaped inverted trapezoidal structure. Specifically, one end of the blocking wall 600, which has a smaller cross-sectional area, is disposed on the non-pixel region 400. Another end of the blocking wall 600, which has a larger cross-sectional area, is disposed at one side close to the thin film encapsulation layer 900. A "wide upper end and narrow lower end" structure of the blocking wall 600 causes light emitted from the sub-pixel regions 300 to be reflected from an inner side of the blocking wall 600 and incident into the light-transmissive hole 500. Generally, the sub-pixel regions 300 disposed within the blocking wall 600 are equally distributed on both sides of the light-transmissive hole 500, so that the light incident into the light-transmissive hole 500 is uniform.

A material of the cathode electrode 700 covers upper surfaces of the blocking wall 600 and pixel defining layer 200. An inner side of the blocking wall 600 is coated with the material of the cathode electrode 700 to form a light-emitting coating which is light reflective. At the same time, the light-transmissive hole 500, the cathode electrode 700, and the blocking wall 600 enclosingly form a sealing structure. The light-transmissive hole 500 is filled with a high light-transmissive material 800. The high light-transmissive material 800 is filled to a height level aligned with a top of the blocking wall 600. This way, the cathode electrode 700 above the light-transmissive hole 500 is kept horizontal, and a portion of the light emitted from the sub-pixel regions 300 around the light-transmissive hole 500 is directed vertically upward with respect to the light-transmissive hole 500, so that the OLED display panel 10 displays images normally.

Furthermore, the thin film encapsulation layer 900 comprises a first inorganic layer 910, a first organic layer 920, and a second inorganic layer 930 disposed on the cathode electrode 700 in sequence. The first organic layer 920 makes the OLED display panel 10 have an even and flat surface. A refractive index of the first inorganic layer 910 is greater than a refractive index of the first organic layer 920. Therefore, it can be ensured that, inside the blocking wall 600, that is, around the light-transmissive hole 500, the light emitted by the sub-pixel regions 300 is reflected by total internal reflection at an interface between the first inorganic layer 910 and the first organic layer 920 and is then incident into the light-transmissive hole 500 to form a bright light spot, thereby causing an image to be able to be displayed in the light transmissive hole 500. Because the image displayed in the light-transmissive hole 500 is formed by reflecting the light from the sub-pixel regions 300 located around the light-transmissive hole 500, the image displayed in the light-transmissive hole 500 is integrated with the image displayed around the light-transmissive hole 500. As a result, the influence of the light-transmissive hole 500 on aesthetics and appearance integrity of the OLED display panel 10 is sufficiently reduced.

Figure 2:
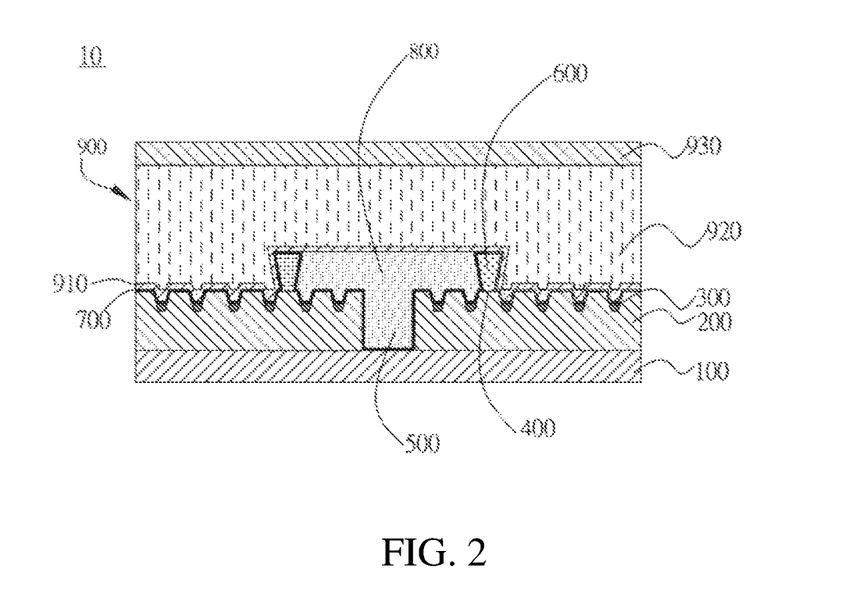
FIG. 2 is a cross-sectional structural view taken along A-A section line of FIGS. 1A to 1C.

Furthermore, please refer to FIG. 2A, which shows a top view of the OLED display panel 10 according to the present embodiment. The light-transmissive hole 500 has a diamond-shaped cross-section, and the blocking wall 600 also has a diamond-shaped cross-section. The cross-sectional shape of the light-transmissive hole 500 and the blocking wall 600 may also be designed into other shapes, such as a circular shape, a polygonal shape, or an elliptical shape. For example, as shown in FIG. 2B, the cross-sectional shapes of the light-transmissive hole 500 and the blocking wall 600 are both circular. In another example, as shown in FIG. 2C, the light-transmissive hole 500 and the blocking wall 600 both have a polygonal-shaped cross-section.

Second Embodiment

Figure 3:
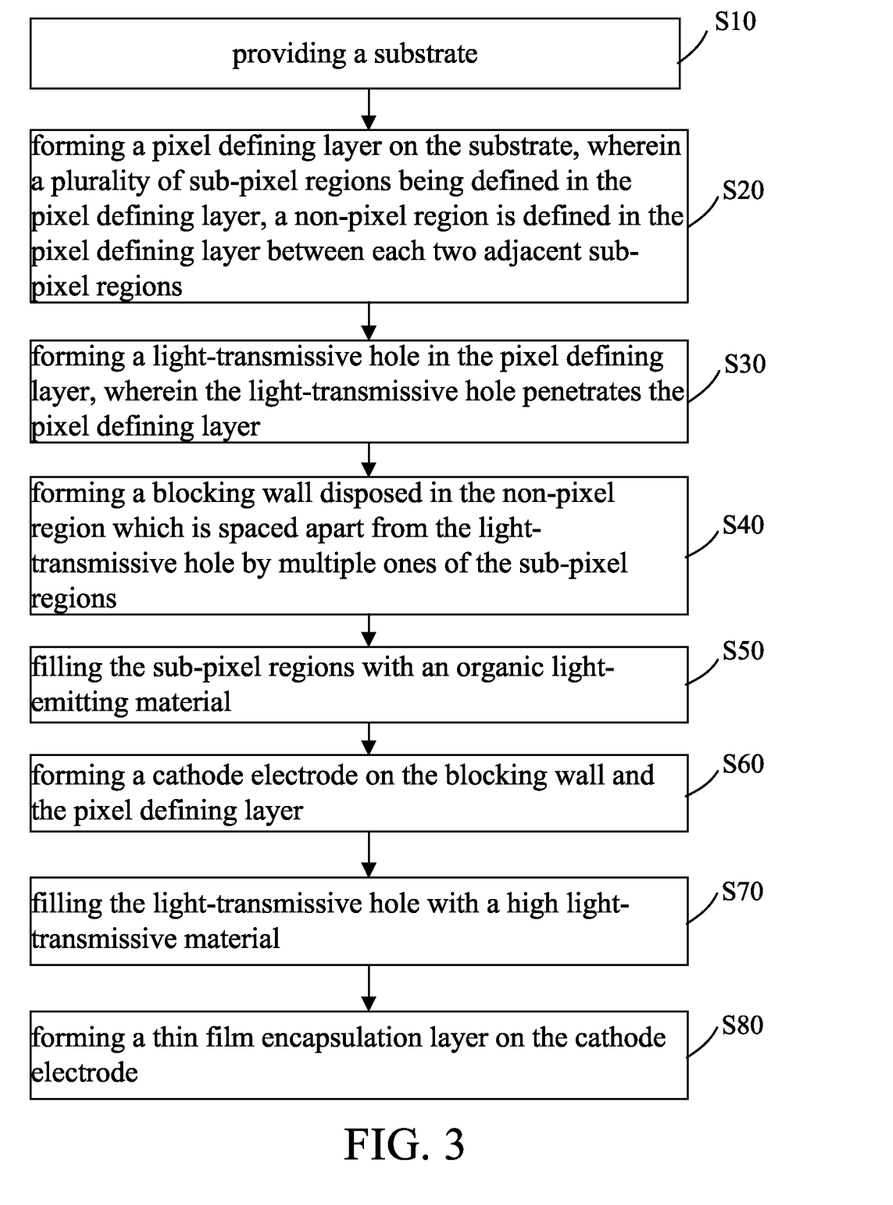
FIG. 3 is a process flow diagram illustrating a manufacturing method of an OLED display panel according to a second embodiment of the present invention.

Please refer to FIG. 3. A manufacturing method of the OLED display panel of the first embodiment is provided, comprising steps as follows:

S10: providing a substrate 100, wherein the substrate 100 can be a glass substrate or a flexible substrate.

S20: forming a pixel defining layer 200 on the substrate 100, wherein a plurality of sub-pixel regions 300 are defined in the pixel defining layer 200, a non-pixel region 400 is defined in the pixel defining layer 200 between each two adjacent sub-pixel regions 300.

Figure 4A:
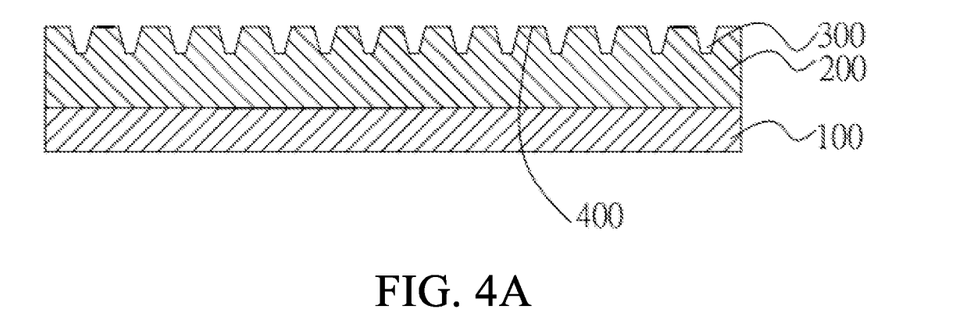
FIGS. 4A, 4B, 4C, 4D, 4E, 4F and 4G are schematic views illustrating the manufacturing method of the OLED display panel according to the second embodiment of the present invention.

Referring to FIG. 4A, the pixel defining layer 200 and film layers under the pixel defining layer 200 are formed on the substrate 100. In the present embodiment, the manufacturing method of the OLED display panel 10 further comprises:

S201: forming a thin film transistor (TFT) layer on the substrate 100;

S202: forming a planarization layer on the TFT layer;

S203: forming an anode electrode on the planarization layer, wherein the anode electrode is disposed in the sub-pixel regions 300.

Figure 4B:
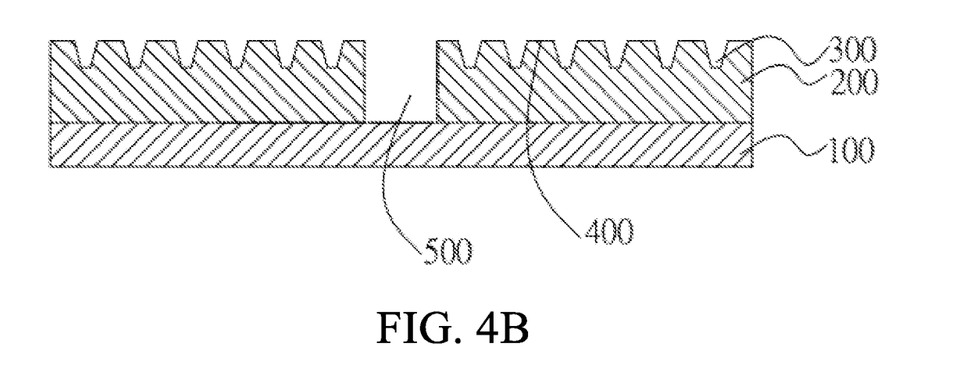

S30: forming a light-transmissive hole 500 in the pixel defining layer 200, wherein the light-transmissive hole 500 penetrates the pixel defining layer 200.

As shown in FIG. 4B, the planarization layer, the anode electrode, and the pixel defining layer 200 are partially etched away to form the light-transmissive hole 500 according to a requirement for a camera opening, so that the light-transmissive hole 500 penetrates through the pixel defining layer 200. Actually, the light-transmissive hole 500 penetrates through the planarization layer, the anode electrode, and the pixel defining layer 200. A shape of the light-transmissive hole 500 can be designed into different shapes according to actual needs, such as a diamond shape, a circular shape, a polygonal shape, and an elliptical shape.

Figure 4C:
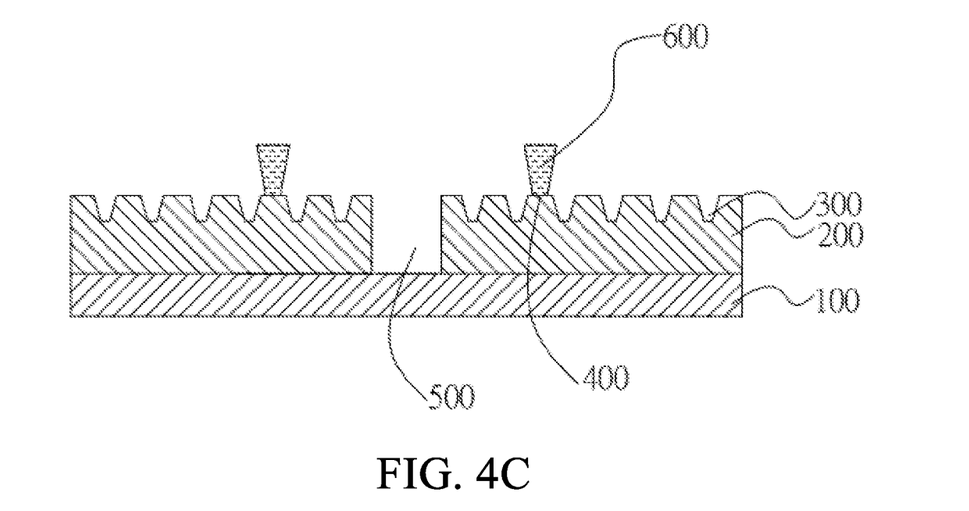

S40: forming a blocking wall 600 in the non-pixel region 300 which is spaced apart from the light-transmissive hole 500 by multiple ones of the sub-pixel regions 300.

As shown in FIG. 4C, the number of the sub-pixel regions 300 spacing the blocking wall 600 from the light-transmissive hole 500 may depend on a size of the light-transmissive hole 500. Generally speaking, the sub-pixel regions 300 located in the blocking wall 600 are equally distributed to both sides of the light-transmissive hole 500, so that the light incident into the light-transmissive hole 500 is uniform. The blocking wall 600 is a ring-shaped inverted trapezoidal structure. Similarly, a cross-section of the blocking wall 600 may be of a diamond shape, a circular shape, a polygonal shape, an elliptical shape, or the like. A material of the blocking wall 600 is PS.

Figure 4D:
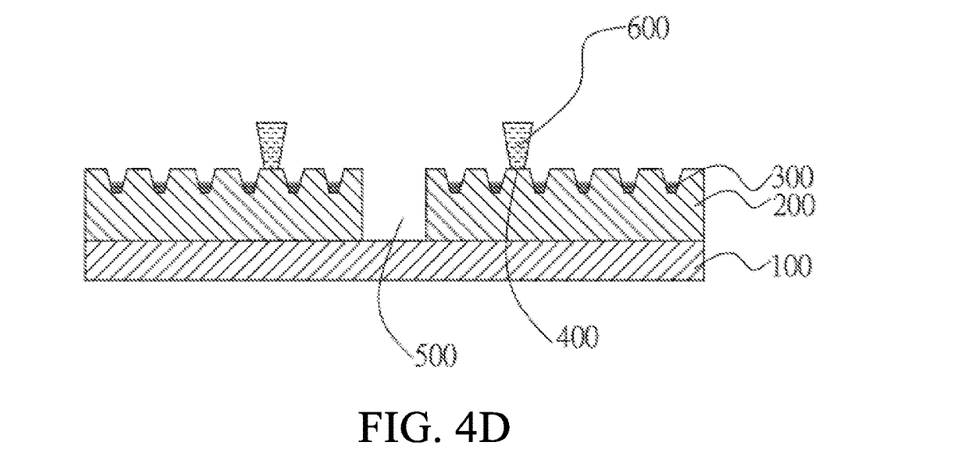

S50: filling the sub-pixel regions with an organic light-emitting material.

As shown in FIG. 4D, the organic light-emitting material may be filled in the sub-pixel regions 300 by an evaporation method, and the organic light-emitting material is capable of displaying at least three different colors—they generally are red, green, blue which are three basic colors.

Figure 4E:
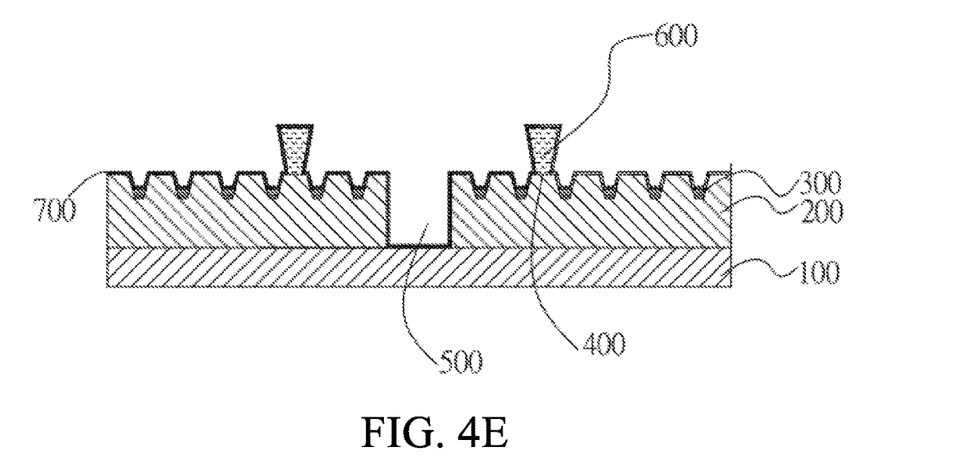

S60: forming a cathode electrode 700 on the blocking wall 600 and the pixel defining layer 200.

As shown in FIG. 4E, surfaces of the blocking wall 600 and the pixel defining layer 200 may be coated with a material of the cathode electrode 700 by the evaporation method, and an inner side of the blocking wall 600 is coated with the material of the cathode electrode to form a light emitting coating which is light reflective.

Figure 4F:
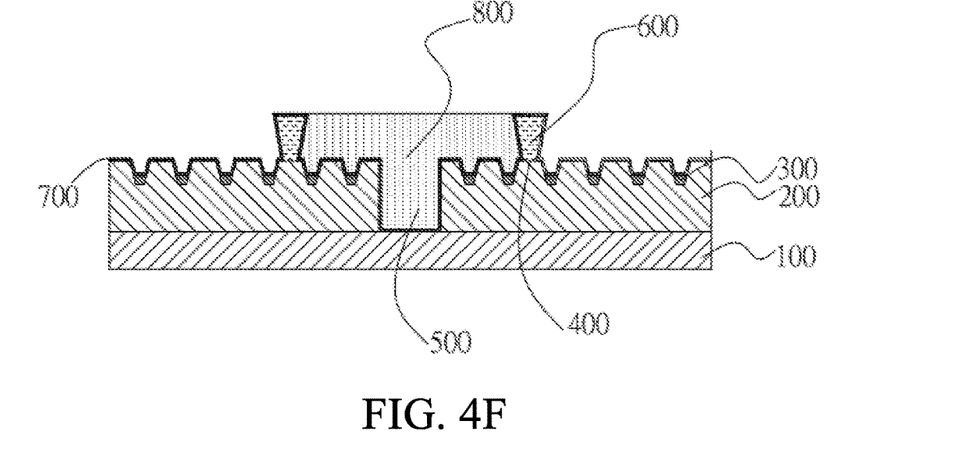

S70: filling the light-transmissive hole 500 with a high light-transmissive material 800.

As shown in FIG. 4F, the high light-transmissive material 800 is filled to a height level aligned with a top of the blocking wall 600. The top of the blocking wall 600 and a top of the high light-transmissive material 800 are on a same horizontal line, so that a light transmission performance is good. The high light-transmissive material 800 is filled into the light-transmissive hole 500 by inkjet printing.

Figure 4G:
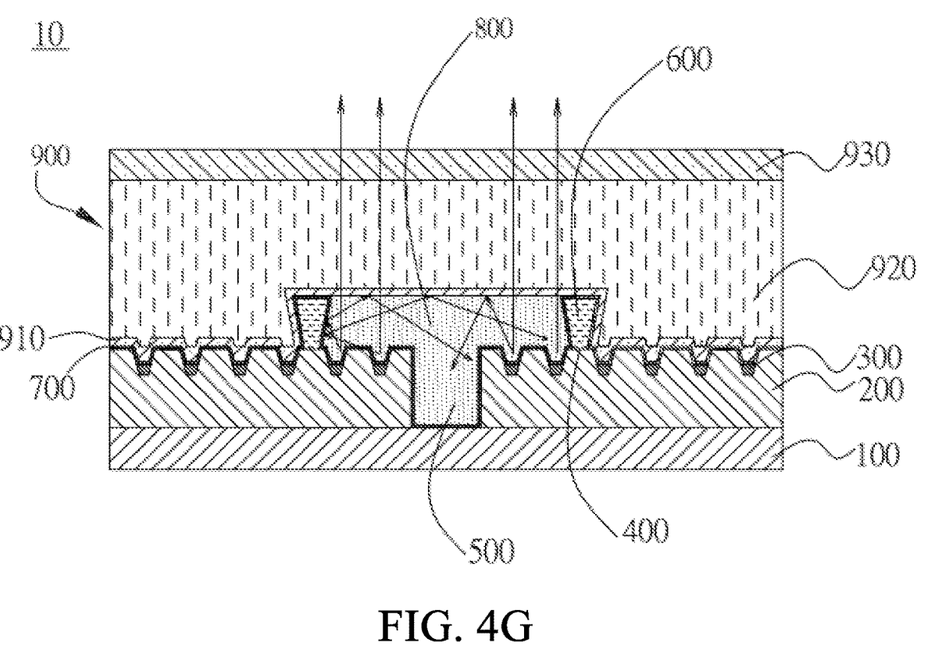

S80: forming a thin film encapsulation layer 900 on the cathode electrode 700.

As shown in FIG. 4G, the thin film encapsulation layer 900 includes a first inorganic layer 910, a first organic layer 920, and a second inorganic layer 930 sequentially formed on the cathode electrode 700, formed by the following steps:

S801: forming the first inorganic layer 910 on the cathode electrode 700.

The first inorganic layer 910 is formed by a deposition method. The deposition method is not limited to plasma enhanced chemical vapor deposition (PECVD), atomic layer deposition (ALD), and pulsed laser deposition (PLD), and a sputter deposition method. A material of the first inorganic layer 910 is not limited to SiNx, SiOxNy, SiOx, SiCxNy, ZnO, and AlOx.

S802: forming the first organic layer 920 on the first inorganic layer 910.

It is necessary to ensure that the first organic layer 920 can make a surface of the produced OLED display panel 10 even and flat, and a refractive index of the first inorganic layer 910 is greater than a refractive index of the first organic layer 920. Therefore, a portion of the light emitted from the sub-pixel regions 300 inside the blocking wall 600 encounters an inner reflective side of the blocking wall 600, and then is reflected to reach an interface between the first inorganic layer 910 and the first organic layer 920, so that total internal reflection occurs at the interface to form a bright light spot. Therefore, images can also be displayed in the light-transmissive hole 500 of the OLED display panel 10. The images displayed in the light-transmissive hole 500 are formed by reflecting the light emitted from the sub-pixel regions 300 around the light-transmissive hole, so the images in the light-transmissive hole 500 are integrated with the images around the light-transmissive hole 500, thus sufficiently reducing influence of the light-transmissive hole 500 on aesthetics and appearance integrity of the OLED display panel 10.

S803: forming the second inorganic layer 930 on the first organic layer 920;

Similarly, the second inorganic layer 930 is formed by a deposition method, and the deposition method is not limited to PECVD, ALD, PLD, and sputtering deposition. A material of the second inorganic layer 930 is not limited to SiNx, SiOxNy, SiOx, SiCxNy, ZnO, and AlOx.

Advantages of the present disclosure: In the OLED display panel and the manufacturing method thereof, the light-transmissive hole is defined in the OLED display panel, the blocking wall is disposed outside some of the sub-pixel regions around the light-transmissive hole, a thin-film encapsulation layer is disposed on the blocking wall, and light emitted from the sub-pixel regions inside the blocking wall is partially reflected by the inner reflective surface of the blocking wall to reach the thin film encapsulation layer to cause total internal reflection to occur at an interface of the thin film encapsulation layer to form a bright light spot, so that an image can be displayed in the light-transmissive hole of the OLED display panel, and the displayed image is integrated with a surrounding image. As a result, an opening for the under-screen camera less affects aesthetics and appearance integrity of the OLED display panel, and a display effect is improved.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. An organic light emitting diode (OLED) display panel, comprising:
    a substrate;
    a pixel defining layer disposed on the substrate, a plurality of sub-pixel regions defined in the pixel defining layer, an organic light-emitting material disposed in each of the sub-pixel regions, wherein a plurality of non-pixel regions are defined in the pixel defining layer, and each of the non-pixel regions is located between two adjacent sub-pixel regions;
    a light-transmissive hole defined in the pixel defining layer, the light-transmissive hole penetrating the pixel defining layer;
    a blocking wall disposed in the non-pixel regions and located spaced apart from the light-transmissive hole by multiple ones of the sub-pixel regions, the blocking wall made of polystyrene;
    a cathode electrode covering the blocking wall and the pixel defining layer; and
    a thin-film encapsulation layer disposed on the cathode electrode.

2. The OLED display panel according to claim 1, wherein the blocking wall is a ring-shaped inverted trapezoidal structure.

3. The OLED display panel according to claim 2, wherein a height of the blocking wall ranges from 1 to 10 um.

4. The OLED display panel according to claim 1, wherein the light-transmissive hole is filled with a high light-transmissive material.

5. The OLED display panel according to claim 4, wherein the high light-transmissive material is filled to a height level aligned with a top of the blocking wall.

6. The OLED display panel according to claim 4, wherein the light-transmissive hole has a diamond-shaped cross-section.

7. The OLED display panel according to claim 1, wherein the thin-film encapsulation layer comprises a first inorganic layer, a first organic layer, and a second inorganic layer sequentially disposed on the cathode electrode.

8. The OLED display panel according to claim 7, wherein a refractive index of the first inorganic layer is greater than a refractive index of the first organic layer.

9. An organic light emitting diode (OLED) display panel, comprising:
   a substrate;
   a pixel defining layer disposed on the substrate, a plurality of sub-pixel regions defined in the pixel defining layer, an organic light-emitting material disposed in each of the sub-pixel regions, wherein a plurality of non-pixel regions are defined in the pixel defining layer, and each of the non-pixel regions is located between two adjacent sub-pixel regions;
   a light-transmissive hole defined in the pixel defining layer, the light-transmissive hole penetrating the pixel defining layer;
   a blocking wall disposed in the non-pixel regions and located spaced apart from the light-transmissive hole by multiple ones of the sub-pixel regions;
   a cathode electrode covering the blocking wall and the pixel defining layer; and
   a thin-film encapsulation layer disposed on the cathode electrode.

10. The OLED display panel according to claim 9, wherein the blocking wall is a ring-shaped inverted trapezoidal structure.

11. The OLED display panel according to claim 10, wherein a height of the blocking wall ranges from 1 to 10 um.

12. The OLED display panel according to claim 9, wherein an inner side of the blocking wall is coated with a material of the cathode electrode.

13. The OLED display panel according to claim 9, wherein the light-transmissive hole is filled with a high light-transmissive material.

14. The OLED display panel according to claim 13, the high light-transmissive material is filled to a height level aligned with a top of the blocking wall.

15. The OLED display panel according to claim 13, wherein the light-transmissive hole has a diamond-shaped cross-section.

16. The OLED display panel according to claim 9, wherein the thin-film encapsulation layer comprises a first inorganic layer, a first organic layer, and a second inorganic layer sequentially disposed on the cathode electrode.

17. The OLED display panel according to claim 16, wherein a refractive index of the first inorganic layer is greater than a refractive index of the first organic layer.

18. A manufacturing method of an organic light emitting diode (OLED) display panel, comprising steps as follows:
   S10: providing a substrate;
   S20: forming a pixel defining layer on the substrate, wherein a plurality of sub-pixel regions are defined in the pixel defining layer, and a plurality of non-pixel regions are defined in the pixel defining layer, and each of the non-pixel regions is located between two adjacent sub-pixel regions;
   S30: forming a light-transmissive hole in the pixel defining layer, wherein the light-transmissive hole penetrates the pixel defining layer;
   S40: forming a blocking wall in the non-pixel regions, wherein the blocking wall is located spaced apart from the light-transmissive hole by multiple ones of the sub-pixel regions;
   S50: filling the sub-pixel regions with an organic light-emitting material;
   S60: forming a cathode electrode on the blocking wall and the pixel defining layer;
   S70: filling the light-transmissive hole with a high light-transmissive material; and
   S80: forming a thin film encapsulation layer on the cathode electrode.

19. The manufacturing method of the OLED display panel according to claim 18, wherein the thin-film encapsulation layer comprises a first inorganic layer, a first organic layer, and a second inorganic layer sequentially disposed on the cathode electrode, and a refractive index of the first inorganic layer is greater than a refractive index of the first organic layer.

20. The manufacturing method of the OLED display panel according to claim 18, wherein the high light-transmissive material is filled into the light transmissive hole by ink-jet printing.

* * * * *